United States Patent
Shindo et al.

(10) Patent No.: US 11,335,567 B2
(45) Date of Patent: May 17, 2022

(54) ETCHING METHOD AND ETCHING APPARATUS

(71) Applicant: Tokyo Electron Limited, Tokyo (JP)

(72) Inventors: Naoki Shindo, Nirasaki (JP); Ryo Kuwajima, Nirasaki (JP); Satoshi Toda, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/019,716

(22) Filed: Sep. 14, 2020

(65) Prior Publication Data
US 2021/0090898 A1  Mar. 25, 2021

(30) Foreign Application Priority Data
Sep. 20, 2019 (JP) .............................. JP2019-172065

(51) Int. Cl.
*H01L 21/67* (2006.01)
*H01L 21/3213* (2006.01)

(52) U.S. Cl.
CPC .. *H01L 21/32138* (2013.01); *H01L 21/67069* (2013.01)

(58) Field of Classification Search
CPC .................... H01L 21/32138; H01L 21/67069
See application file for complete search history.

(56) References Cited

U.S. PATENT DOCUMENTS

| | | | | |
|---|---|---|---|---|
| 2012/0180811 | A1* | 7/2012 | Gunji | C23C 16/4405 134/2 |
| 2017/0133233 | A1* | 5/2017 | Sato | H01L 21/3065 |
| 2017/0256463 | A1* | 9/2017 | Bailey, III | H01L 22/26 |
| 2020/0066541 | A1* | 2/2020 | Yamauchi | H01L 21/67069 |

FOREIGN PATENT DOCUMENTS

| | | |
|---|---|---|
| JP | 2519625 B2 | 5/1996 |
| JP | 2015-12243 A | 1/2015 |
| JP | 2015-19065 A | 1/2015 |
| JP | 2018-150612 A | 9/2018 |
| WO | WO-2018128078 A1 * | 7/2018 ........... H01L 23/532 |

OTHER PUBLICATIONS

Oxygen-Britannica Online Encyclopedia via https://web.archive.org/web/20160611150256/https://www.britannica.com/print/article/436806 ; pp. 1-4 (Year: 2016).*
Wikipedia, the free encyclopedia, "Oxygen" via https://web.archive.org/web/20160110011646/https://en.wikipedia.org/wiki/Oxygen pp. 1-23 (Year: 2016).*

* cited by examiner

*Primary Examiner* — Binh X Tran
(74) *Attorney, Agent, or Firm* — Nath, Goldberg & Meyer; Jerald L. Meyer; Tanya E. Harkins

(57) ABSTRACT

There is provided an etching method, including: loading a substrate having a metallic film formed on the substrate into a processing container; and subsequently, oxidizing and etching the metallic film by setting an internal pressure of the processing container to a pressure higher than $2.40 \times 10^4$ Pa and supplying an oxidizing gas for oxidizing the metallic film and an etching gas comprising β-diketone into the processing container.

16 Claims, 5 Drawing Sheets

ETCHING METHOD AND ETCHING APPARATUS

CROSS-REFERENCE TO RELATED APPLICATION

This application is based upon and claims the benefit of priority from Japanese Patent Application No. 2019-172065, filed on Sep. 20, 2019, the entire contents of which are incorporated herein by reference.

TECHNICAL FIELD

The present disclosure relates to an etching method and an etching apparatus.

BACKGROUND

There is a need to form a fine wiring as a wiring of a semiconductor device, and Co, for example, is considered to be used as a metal that constitutes the wiring. Patent Documents 1 to 3 disclose techniques for dry-etching a metal on a surface of a substrate such as a semiconductor wafer or the like (hereinafter referred to as a wafer).

For example, Patent Document 1 discloses that a Co film on a surface of a substrate is etched by simultaneously supplying an oxygen gas and a hexafluoroacetylacetone (Hfac) gas, which is β-diketone, while heating the Co film on the surface of the substrate to 200 degrees C. to 400 degrees C., so that a flow rate ratio of the oxygen ($O_2$) gas to the Hfac gas becomes 1% or less. Patent Document 2 discloses that a Hfac gas is used to etch a Co film on a surface of a substrate and at that time, an oxygen gas may be added to the Hfac gas. Furthermore, Patent Document 3 discloses that metal contaminants such as copper and the like on a surface of a substrate are removed by causing them to react with β-diketone in an oxidizing atmosphere. Moreover, Patent Document 4 discloses a technique in which when a processing gas is supplied into a processing container, a ballast gas is introduced into an exhaust pipe to suppress the inflow of the processing gas into the exhaust pipe and in which a partial pressure of the processing gas inside the processing container is quickly increased.

PRIOR ART DOCUMENT

Patent Document

Patent Document 1: Japanese Laid-open publication No. 2015-012243 (Paragraphs 0030 to 0035)
Patent Document 2: Japanese Laid-open Publication No. 2015-019065 (Paragraphs 0037 and 0042)
Patent Document 3: Japanese Patent No. 2519625 (Paragraphs 0035 and 0036)
Patent Document 4: Japanese Laid-open Publication No. 2018-150612 (Paragraph 0047)

SUMMARY

According to one embodiment of the present disclosure, there is provided an etching method, including: loading a substrate having a metallic film formed on the substrate into a processing container; and subsequently, oxidizing and etching the metallic film by setting an internal pressure of the processing container to a pressure higher than $2.40 \times 10^4$ Pa and supplying an oxidizing gas for oxidizing the metallic film and an etching gas comprising β-diketone into the processing container.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

An etching apparatus 1 for etching a Co film formed on a surface of a wafer W which is a substrate will be described with reference to a vertical sectional side view of FIG. 1. The etching apparatus 1 includes a processing container 11 in which a vacuum atmosphere is formed and in which the wafer W is accommodated. Inside the processing container 11, a stage 12 which is a placement part for the wafer W is provided. The wafer W placed on the stage 12 is heated by a heater 13 embedded in the stage 12 to a set temperature.

Figure 1:
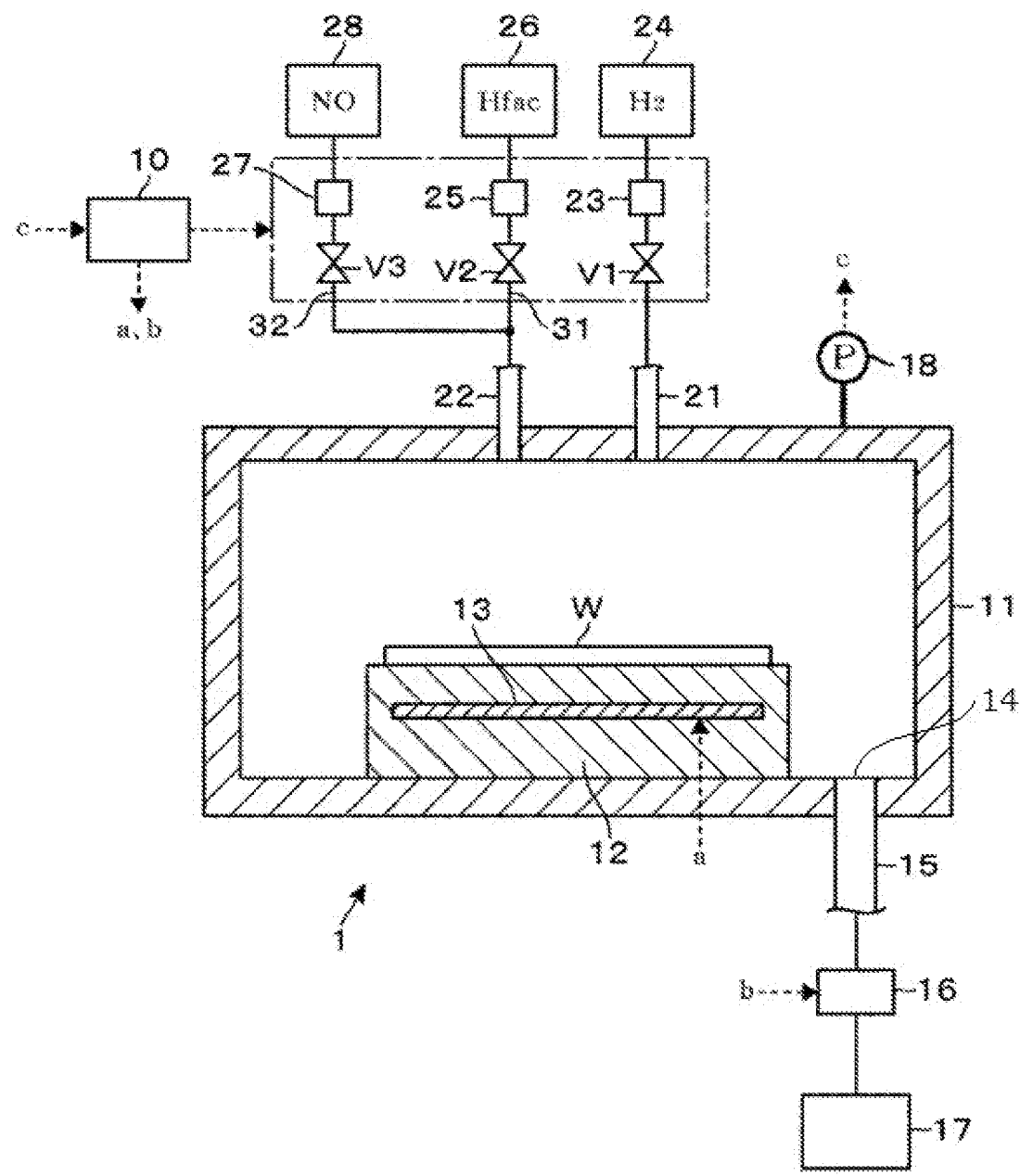
FIG. 1 is a vertical sectional side view showing an etching apparatus according to an embodiment of the present disclosure.

Reference numeral 14 in FIG. 1 denotes an exhaust port opened at the bottom of the processing container 11. One end of an exhaust pipe 15 is connected to the exhaust port 14. The other end of the exhaust pipe 15 is connected to a vacuum pump 17 which is a vacuum exhaust mechanism. A valve 16 is installed in the exhaust pipe 15. By changing an opening degree of the valve 16, an exhaust gas flow rate in the exhaust path in the exhaust pipe 15 is changed so that an internal pressure of the processing container 11 can be regulated. Furthermore, a pressure measurement part 18 for measuring the internal pressure of the processing container 11 is provided in the processing container 11. The pressure measurement part 18 transmits a signal (measurement signal) corresponding to the measured pressure to a controller 10 which will be described later.

At a ceiling portion of the processing container 11, a downstream end of a pipe 21 and a downstream end of a pipe 22 are opened. An upstream end of the pipe 21 is connected to a source 24 of a hydrogen ($H_2$) gas, which is a reducing gas, through a valve V1 and a flow rate regulator 23 in the named order. An upstream side of the pipe 22 is branched to form a branch pipe 31 and a branch pipe 32. The branch pipe 31 is connected to a source 26 of a hexafluoroacetylacetone (Hfac, which is also referred to as 1,1,1,5,5,5-hexafluoro-2, 4-pentanedione) gas, which is β-diketone, through a valve V2 and a flow rate regulator 25 in the named order. An upstream end of the branch pipe 32 is connected to a source 28 of a nitric oxide (NO) gas, which is an oxidizing gas, through a valve V3 and a flow rate regulator 27 in the named order. The sources 24, 26 and 28 constitute a reducing gas supply part, an etching gas supply part and an oxidizing gas supply part, respectively. The present disclosure is not limited to supplying the gas from the pipe to a processing space inside the processing container 11 as in the example shown in FIG. 1. For example, the gas may be supplied in the form of a shower into the processing space using a shower head.

By opening and closing the valves V1, V2 and V3, the supply/cutoff of the $H_2$ gas, the Hfac gas and the NO gas into the processing container 11 is switched. Furthermore, flow rates of the $H_2$ gas, the Hfac gas and the NO gas to be supplied into the processing container 11 are adjusted by the flow rate regulators 23, 25 and 27, respectively. Since the NO gas and the Hfac gas are supplied to the pipe 22 common to these gases, they may be supplied into the processing container 11 in a mixed state.

Furthermore, the etching apparatus 1 includes the controller 10. The controller 10 is configured by, for example, a computer, and includes a program, a memory and a CPU. The program incorporates a group of steps for executing a series of operations mentioned in the operation description below. By virtue of the program, a control signal is outputted to each part of the etching apparatus 1, whereby the operation of each part is controlled. Furthermore, the controller 10 stores set pressures P1 and P2 (P1<P2) of a processing recipe which will be described later. Then, based on the measurement signal outputted from the pressure measurement part 18, the opening degree of the valve 16 is adjusted by the control signal so that the internal pressure of the processing container 11 becomes the preset set pressures P1 or P2. The valve 16 and the controller 10 correspond to an exhaust flow rate changing part. The aforementioned program is stored in a non-transitory computer-readable storage medium, for example, a compact disc, a hard disc, a magneto-optical disc, a memory card, a DVD or the like, and installed on the controller 10.

Figure 2:
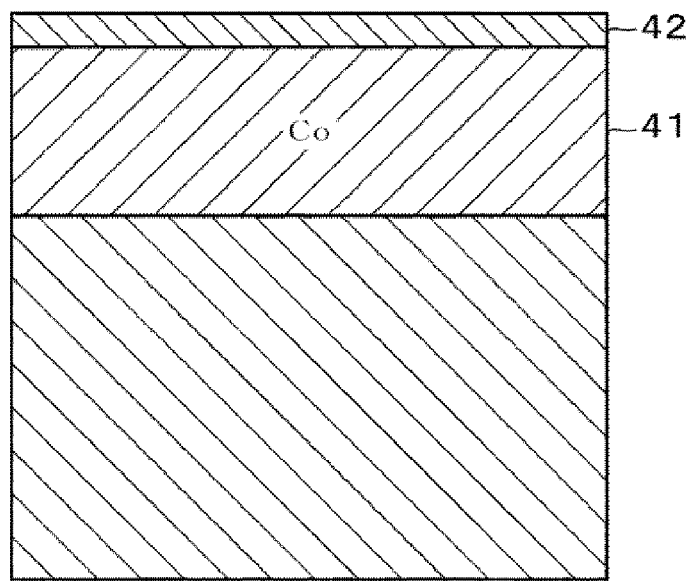
FIG. 2 is a vertical sectional side view of a wafer processed by the etching apparatus.

The reason why the $H_2$ gas as a reducing gas is used in the etching apparatus 1 will be described below. FIG. 2 is a vertical sectional side view of the wafer W transferred to the etching apparatus 1. As described above, a Co film 41 which is a metallic film that constitutes a wiring of a semiconductor device is formed on the surface of the wafer W which is a substrate. The surface of the Co film 41 is naturally oxidized and contains a relatively large amount of Co and a relatively large amount of CoO and $Co(OH)_2$ which are oxides of Co. The surface of the Co film 41 is indicated as a natural oxide film 42. As time elapses from the formation of the Co film 41, a ratio of CoO and $Co(OH)_2$ to Co in the natural oxide film 42 increases.

On the other hand, in the etching apparatus 1, the Hfac gas and the NO gas are supplied to the Co film 41 to etch the Co film 41. It is considered that the etching of Co is performed through the following three steps. First, in a first step, NO reacts with the outermost electron of Co to oxidize Co. Specifically, the reaction of the following formula 1 proceeds to produce CoO. Then, in a second step, the adsorption of NO on CoO and the formation of a complex $(Co(hfac)_2)$ by coordination of Hfac to Co subsequent to the adsorption occur. Then, in a third step, the $Co(hfac)_2$ having a relatively high vapor pressure is sublimated and Co is etched. Equation 2 below indicates the reactions in the second and third steps mentioned above. CoO—NO in Equation 2 represents NO adsorbed on CoO. As described above, the etching is performed though the three steps. The etching rate of Co is determined by the balance between the formation of CoO in the first step and the formation of the complex in the second step.

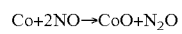
$$Co+2NO \rightarrow CoO+N_2O \qquad \text{Equation 1}$$

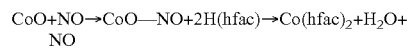
$$CoO+NO \rightarrow CoO—NO+2H(hfac) \rightarrow Co(hfac)_2+H_2O+ \\ NO \qquad \text{Equation 2}$$

The present applicant has confirmed that the etching amount (etching rate) of the Co film 41 per unit time can be increased by performing a reduction (modification) process on the natural oxide film 42 and then performing the etching of the Co film 41 through the supply of the Hfac gas and the NO gas. This is because CoO and $Co(OH)_2$ are converted into Co by the reduction process, and subsequently, CoO as described in Equation 1 is reproduced by the oxidation action of NO so that the above-described reaction occurs. Further, when the oxidation process is performed after forming the Co film, if the oxidation time is relatively short, the amount of CoO is larger than that of $Co_3O_4$ (more specifically, a mixture of CoO and $C_2O_3$), but if the oxidation time is relatively long, the amount of $Co_3O_4$ is larger than that of CoO. As will be described later in detail, NO is considered to be more easily adsorbed to CoO than $Co_3O_4$. That is, as the oxidation process with NO is performed after the reduction process, a large amount of fresh CoO that has not been changed to $Co_3O_4$ is generated. As NO is adsorbed to the CoO, the reaction of Equation 2 that affects the etching rate of Co easily proceeds. As a result, it is considered that the etching rate increases.

(First Process)

Figure 3:
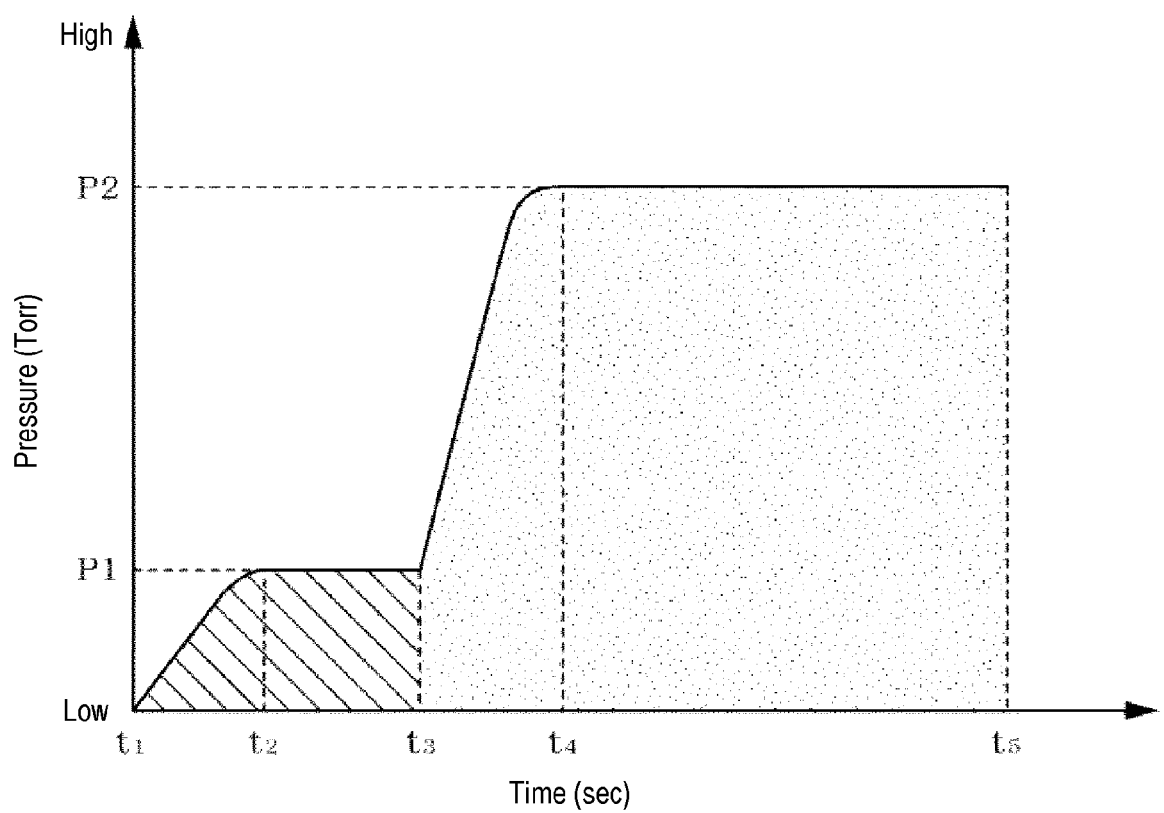
FIG. 3 is a graph showing a transition of an internal pressure of a processing container that constitutes the etching apparatus.

Next, a first process performed using the etching apparatus 1 will be described with reference to FIG. 3 that shows a state inside the processing container 11. The horizontal axis in a graph of FIG. 3 represents an elapsed time from the start of a process in the etching apparatus 1, and the vertical axis represents the internal pressure of the processing container 11. In a region between the line of the graph showing the transition of the pressure and the horizontal axis of the graph, hatching is given to a time zone where the $H_2$ gas is supplied, and dots are given to a time zone where the NO gas and the Hfac gas are supplied.

First, the wafer W described with reference to FIG. 2 is loaded into the processing container 11, placed on the stage 12, and heated by the heater. On the other hand, while keeping the valve 16 at a first opening degree, the interior of the processing container 11 is exhausted, whereby a vacuum atmosphere having a set pressure is formed inside the processing container 11. Then, the valve V1 is opened and the $H_2$ gas is supplied into the processing container 11 at, for example, 200 to 300 sccm (time t1 in the graph), whereby the internal pressure of the processing container 11 rises.

When the temperature of the wafer W reaches a set temperature of, for example, 200 to 250 degrees C., the temperature of the wafer W is kept at the set temperature. On the other hand, when the internal pressure of the processing container 11 reaches a set pressure P1 of $1.33 \times 10^3$ Pa (10 Torr) to $1.33 \times 10^4$ Pa (100 Torr), for example, $0.66 \times 10^4$ Pa to $1.20 \times 10^4$ Pa (50 to 90 Torr) (time t2), the internal pressure of the processing container 11 is kept at the set pressure P1.

Figure 4:
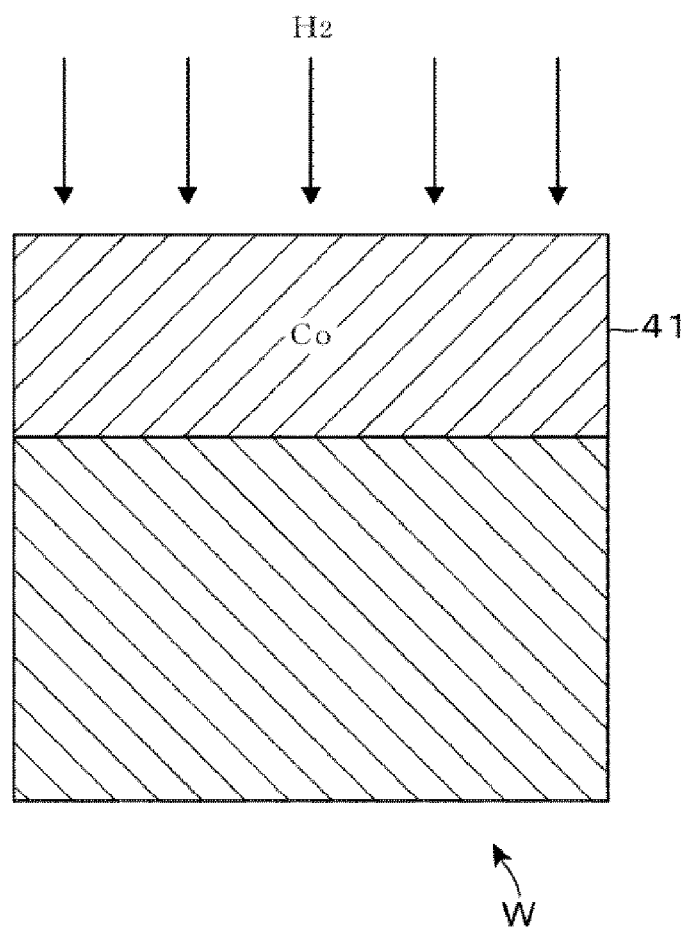
FIG. 4 is a vertical side view of the wafer.

Under such an environment, the wafer W is exposed to the $H_2$ gas, and CoO and $Co(OH)_2$ in the natural oxide film 42 are reduced to Co. Therefore, the natural oxide film 42 shown in FIG. 2 is changed to the Co film 41 as shown in FIG. 4.

When a preset time has elapsed from time t2, the valve V1 is closed and the valves V2 and V3 are opened so that the Hfac gas and the NO gas are supplied to the wafer W inside the processing container 11 (time t3). After time t3, for example, the temperature of the wafer W is continuously maintained at 220 degrees C. Furthermore, the flow rates of the NO gas and the Hfac gas to be supplied into the processing container 11 are controlled so that, for example, a ratio of the flow rate of the NO gas/the flow rate of the Hfac gas is 0.001 to 0.7. The flow rate of the NO gas is 0.5 to 35 sccm, and the flow rate of the Hfac gas is 50 to 500 sccm. The opening degree of the valve 16 becomes a second opening degree smaller than the first opening degree so that the set pressure P2 is obtained while supplying the NO gas and the Hfac gas. As a result, the internal pressure of the processing container 11 rises from $0.66 \times 10^4$ Pa to $1.20 \times 10^4$ Pa (50 to 90 Torr). When the internal pressure of the processing container 11 reaches the set pressure P2 of, for example, $1.33 \times 10^4$ Pa (100 Torr) to $9.3 \times 10^4$ Pa (700 Torr), more specifically $4.0 \times 10^4$ Pa to $4.66 \times 10^4$ Pa (300 to 400 Torr) (time t4), the internal pressure of the processing container 11 is kept at the set pressure P2.

Figure 5:
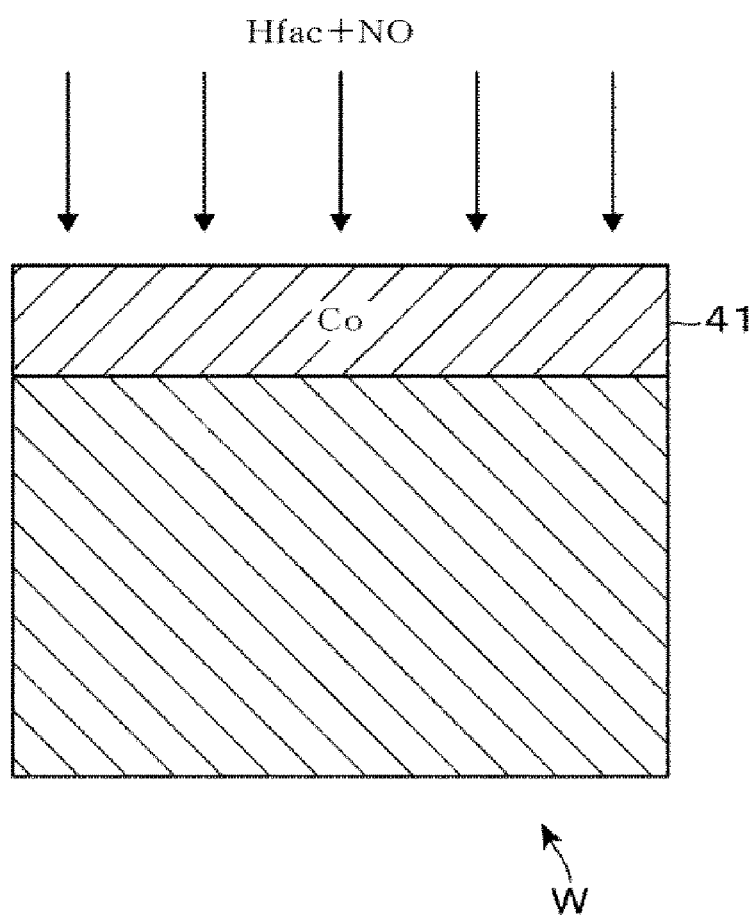
FIG. 5 is a vertical side view of the wafer.

By exposing the Co film 41 to the NO gas and the Hfac gas supplied into the processing container 11 in this way, the reaction represented by Equations 1 and 2 proceeds, and the surface of the Co film 41 is etched (FIG. 5). When the surface of the Co film 41 is etched by a desired amount, the valves V2 and V3 are closed, the supply of the Hfac gas and the NO gas into the processing container 11 is stopped, and the process performed by the etching apparatus 1 is completed (time t5).

The reason why the etching process is performed in a relatively high pressure atmosphere as described above will be described below. The etching process using the Hfac gas tends to have a long process time and have an increased amount of gas required for the process, which poses problems of a decrease in throughput and an increase in apparatus operation cost. Therefore, in the present embodiment, the internal pressure of the processing container 11 after time t3 at which the Hfac gas and the NO gas are supplied is set to a pressure higher than an internal set pressure of $2.40 \times 10^4$ Pa (180 Torr) of the processing container 11 in the related art example, e.g., Japanese Laid-open Publication No. 2015-012243.

By setting the internal pressure of the processing container 11 to a relatively high value in this way, the densities of the Hfac and the NO as etching reaction factors inside the processing container 11 are increased. Therefore, as compared with the case where the Hfac gas and the NO gas are supplied at a relatively low pressure, for example, at the same pressure as the pressure available when supplying the $H_2$ gas, it is possible to improve the etching rate and to secure a desired etching amount in a short period of time. That is, it is possible to shorten the process time by shortening the gas supply time and to reduce the amounts of the Hfac gas and the NO gas required for processing the wafer W. In addition, it is apparent from the comparison between the evaluation test and the reference test described later that the effect of reducing the amount of the gas used can be obtained by increasing the internal pressure of the processing container 11 in this way.

By the way, in the present embodiment, when the internal pressure of the processing container 11 is increased as described above, the opening degree of the valve 16 of the exhaust pipe 15 is reduced and the exhaust flow rate is reduced to increase the pressure. When the exhaust gas flow rate is large, the time during which the gas supplied into the processing container 11 stays inside the processing container 11 becomes short. Therefore, the gas supplied to the processing container 11 is less likely to come into contact with the wafer W, and the amount of the gas exhausted without coming into contact with the wafer is increased. On the other hand, when the exhaust gas flow rate is small, the time during which the gas stays inside the processing container 11 becomes long, and the gas supplied to the processing container 11 is highly likely to make contact with the wafer W. Since the gas easily makes contact with the wafer W in this manner, the supplied gas can be efficiently used. Therefore, a desired etching amount can be secured while reducing the supply amounts of the Hfac gas and the NO gas. As shown in the evaluation test described later, it has been confirmed that deterioration of the surface roughness after etching is not observed even when the gas supply amount is reduced in this way.

As described above, according to the process performed by the etching apparatus 1, when the Co film 41 is etched using the NO gas and the Hfac gas, the internal pressure of the processing container 11 is set to the pressure higher than the conventional pressure of $2.40 \times 10^4$ Pa (180 Torr). Accordingly, the process time of etching can be shortened, and the amounts of the Hfac gas and the NO gas required for etching can be reduced. In addition, the internal pressure of the processing container 11 when performing the etching is preferably equal to or higher than $2.66 \times 10^4$ Pa (200 Torr) or more.

Furthermore, when the internal pressure of the processing container 11 is increased at the time of supplying the Hfac gas and the NO gas, the opening degree of the valve 16 of the exhaust pipe 15 is reduced to reduce the exhaust speed of the gases from the interior of the processing container 11. Therefore, the residence time of the Hfac gas and the NO gas inside the processing container 11 can be prolonged, and the gases can be efficiently supplied to the wafer W. As a result, the consumption of the NO gas and the Hfac gas can be further reduced. For example, as described above, the flow rate of the Hfac gas may be set to 500 sccm or less. Accordingly, it is possible to reduce the operation cost of the apparatus.

By the way, the supply of the Hfac gas and the NO gas may be stopped after the internal pressure of the processing container 11 reaches the set pressure P2 (time t4). In that case, in order to maintain the internal pressure of the processing container 11 at the set pressure P2, for example, the valve 16 is fully closed, i.e., the opening degree of the valve 16 is controlled to be zero, and the exhaust of the interior of the processing container 11 is stopped. As a result, the NO gas and the Hfac gas are contained in the processing container 11, and the etching of the wafer W can be caused to proceed. Therefore, the second opening degree of the valve 16 during etching includes a case where the second opening degree is zero and a case where the second opening degree is not zero. Furthermore, it may be possible to adopt a configuration in which, after time t4, a small amount of the Hfac gas and the NO gas is supplied without stopping the supply of the Hfac and the NO gas.

In this way, for example, during the time period from time t3 to the time t4, which is the former section of the etching period, each of the Hfac and the NO gas is supplied into the processing container 11 at the first flow rate. In the period after time t4, which is the latter section of the etching period, each of the Hfac gas and the NO gas may be supplied into the processing container 11 at the second flow rate lower than the first flow rate to perform the process. Since the process may be performed by enclosing the respective gases in the processing container 11 as described above, the second flow rate may be zero. By controlling the flow rates of the Hfac gas and the NO gas in this way, it is possible to more reliably reduce the amounts of the Hfac gas and the NO gas used.

By the way, a supply pipe to which an inert gas is supplied from a gas source may be connected to the exhaust pipe 15, and the inert gas may be supplied from the gas source to the exhaust pipe 15 via a mass flow controller installed in the supply pipe. In the case of such a configuration, for example, the opening degree of the valve 16 is made constant from time t1 to t5. During the reduction process from time t1 to t3, the inert gas is supplied to the exhaust pipe 15 at the first flow rate. During the etching process from time t3 to t5, the inert gas is supplied to the exhaust pipe 15 at the second flow rate higher than the first flow rate. The state of supplying the inert gas to the exhaust pipe 15 at the first flow rate corresponds to a first state, and the state of supplying the inert gas at the second flow rate corresponds to a second state. By supplying such an inert gas, the exhaust flow rate in the exhaust pipe 15 may be adjusted instead of adjusting the valve 16 to control the internal pressure of the processing container 11. That is, the regulation of the internal pressure of the processing container 11 between the reduction process and the etching process is not limited to being performed by the opening and closing of the valve 16.

Furthermore, as described above, in the present embodiment, the etching rate at the time of etching is increased by performing the reduction process with the $H_2$ gas. By increasing the etching rate, it is possible to further reduce the consumption of the NO gas and the Hfac gas, which makes it possible to more reliably reduce the operation cost of the apparatus. However, etching may be performed without performing the reduction process. By the way, in the reduction process, a relatively high pressure larger than 180 Torr may be used as in the etching process. However, when performing the process with the high-pressure $H_2$ gas, it is preferable that as in the above-described example, the reduction process is performed at a pressure lower than the pressure in the etching process in order to prevent the apparatus configuration from becoming complicated for the purpose of ensuring safety.

During the period from time t2 to time t5 in the above-described process, the temperature of the wafer W is kept constant at 200 to 250 degrees C. However, the present disclosure is not limited to such control of the wafer W. During the period from time t2 to time t3, the temperature may be set to a temperature at which the reduction action of the $H_2$ gas is sufficiently obtained. During the period from time t3 to time t5, the temperature may be set to a temperature at which the decomposition of the Hfac gas is suppressed and the etching can be performed. From that point of view, it is preferable that the wafer W is heated to, for example, 200 degrees C. to 250 degrees C. during the period from time t2 to time t5. Furthermore, the supply flow rate of the $H_2$ gas into the processing container 11 during the period from time t1 to time t3 may be set to a flow rate at which the above-described reduction process can be performed, for example, 50 sccm to 500 sccm.

Furthermore, the Co film 41 subjected to the reduction process may be etched without being exposed to, for example, the air and without forming the natural oxide film 42 again. Therefore, after performing the above-described reduction process with the $H_2$ gas in one processing container 11, the wafer W may be transferred to another processing container 11 through a transfer path having a vacuum atmosphere formed therein and may be subjected to etching with the Hfac gas and the NO gas. However, in order to prevent the throughput from being lowered due to the time required for the transfer of the wafer W between the processing containers 11 and the time required for the temperature adjustment of the wafer W after the transfer of the wafer W to another processing container 11, it is preferable that as in the process performed in the etching apparatus 1, the reduction process and the etching process are performed in the same processing container 11.

Incidentally, the reaction between the surface of the Co film 41 and the NO gas after the reduction performed by the $H_2$ gas when the process is performed by the etching apparatus 1 will be described in detail. As indicated in Equation 1, the surface of the reduced Co film 41 is converted to CoO by the oxidizing action of the supplied NO gas. An unpaired electron exists in a 3d orbital which is an inner shell orbital of a Co atom having a divalent oxidation number and which forms CoO. Since NO also has an unpaired electron, the reactivity between CoO and NO is relatively high. The reaction of CoO and NO causes the electrons of Co to form a hybrid orbit, which makes it easy to form $Co(hfac)_2$. $Co_3O_4$, which is produced in a relatively large amount when the Co film 41 is exposed to an oxidizing atmosphere for a long period of time, does not have an unpaired electron and, presumably, has low reactivity with NO.

Therefore, the oxidizing gas supplied to the wafer W after the reduction performed with the $H_2$ gas is not limited to the NO gas, but it is preferable to use a gas having the above-mentioned unpaired electron in order to increase the reactivity with the generated CoO. Specifically, for example, CO (carbon monoxide) may preferably be used. However, an $O_2$ (oxygen) gas, an $O_3$ (ozone) gas, an $N_2O$ (nitrous oxide) gas, or the like, which has no unpaired electron, may be used as the oxidizing gas.

Furthermore, in the etching apparatus 1 described above, the Hfac gas and the NO gas are supplied into the processing container 11 in a mixed state. However, the present disclosure is not limited to the Hfac gas and the NO gas being supplied in such a mixed state. In other words, the Hfac gas and the NO gas may be supplied to the processing space formed inside the processing container 11 through individually-formed flow paths, may be mixed with each other in the processing space, and may be supplied to the wafer W. Moreover, in the above-described etching apparatus 1, the $H_2$ gas and the mixed gas (of the Hfac gas and the NO gas) are supplied into the processing container 11 through different flow paths. However, the present disclosure is not limited to the $H_2$ gas and the mixed gas being supplied through different flow paths. That is, the mixed gas and the $H_2$ gas may be supplied to a common flow path for these gases, and may be supplied to the surface of the wafer W from this common flow path.

(Second Process)

Figure 6:
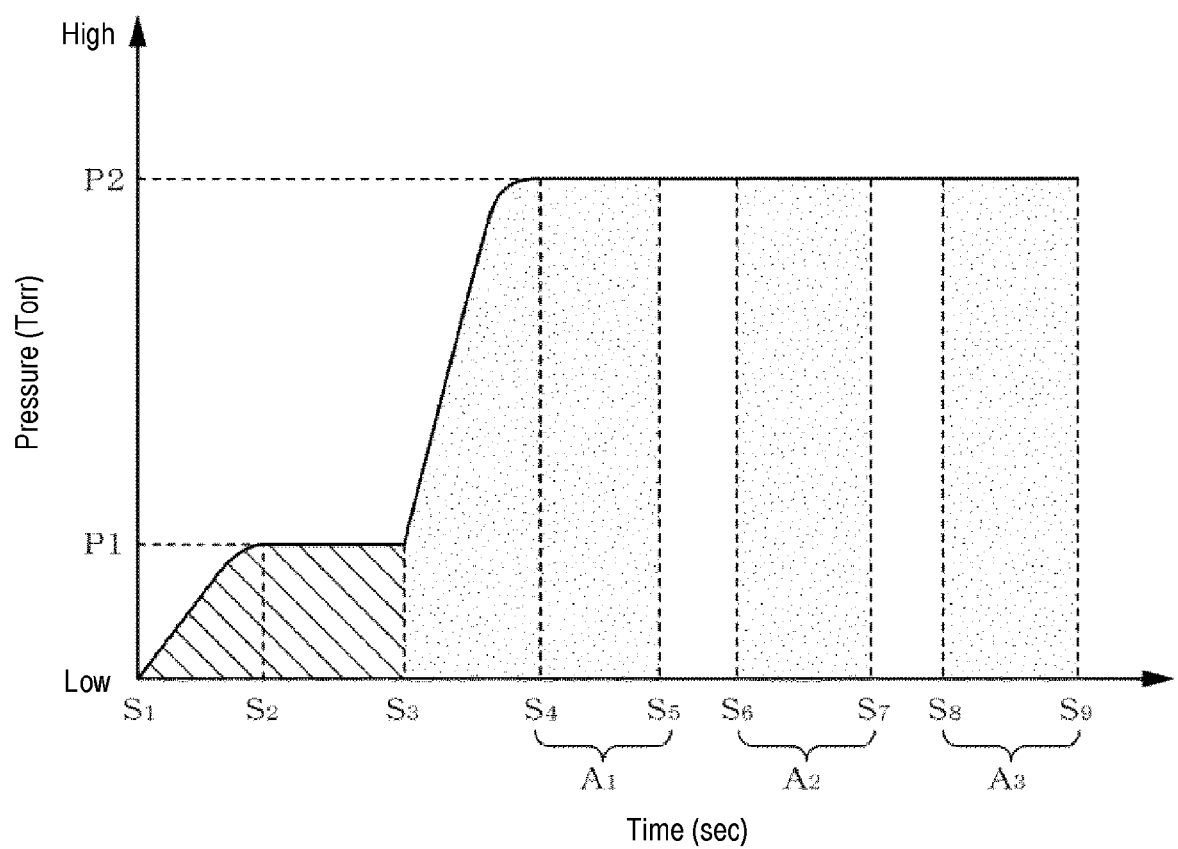
FIG. 6 is a graph showing another example of the transition of the internal pressure of the processing container.

Next, a second process performed using the etching apparatus 1 will be described with reference to a graph of FIG. 6 with a focus on the differences from the first process described with reference to the graph of FIG. 3. In the graph of FIG. 6, just like the graph of FIG. 3, the horizontal axis represents the time and the vertical axis represents the internal pressure of the processing container 11. Hatching and dots represent a period during which the $H_2$ gas is supplied and a period during which the Hfac gas and the NO gas are supplied, respectively.

First, the supply of the $H_2$ gas is started at time s1. On the other hand, when the wafer W is heated and the temperature of the wafer W reaches a set temperature, the wafer W is maintained at the set temperature. Then, at time s2, the internal pressure of the processing container 11 reaches a set pressure P1, and a reduction process is performed while keeping the internal pressure of the processing container 11 at the set pressure P1. The set temperature of the wafer W in the second process is, for example, 200 to 250 degrees C. which is the same as the set temperature of the wafer W in the first process. Moreover, for example, the internal set pressure of the processing container 11 at the time of supplying the $H_2$ gas in the second process is also the same as the internal set pressure of the processing container 11 in the first process. That is, the internal set pressure of the processing container 11 is $0.66 \times 10^4$ Pa to $1.20 \times 10^4$ Pa.

Subsequently, the supply of the $H_2$ gas into the processing container 11 is stopped, the Hfac gas and the NO gas are supplied into the processing container 11, and an etching process is started. With the start of the etching, the internal pressure of the processing container 11 rises from $0.66 \times 10_4$ Pa to $1.20 \times 10^4$ Pa. After the internal pressure of the processing container 11 reaches a set pressure P2 of, for example, $4.0 \times 10^4$ Pa to $4.66 \times 10^4$ Pa (300 to 400 Torr) (time s4), the supply of the Hfac gas and the NO gas into the processing container 11 is stopped at time s5.

Then, at time s6, the supply of the Hfac gas and the NO gas into the processing container 11 is resumed. Then, at time s7, the supply of the Hfac gas and the NO gas into the processing container 11 is stopped. Then, at time s8, the supply of the Hfac gas and the NO gas into the processing container 11 is resumed. Then, at time s9, the supply of the Hfac gas and the NO gas into the processing container 11 is stopped, and the etching process is terminated. For example, during the period from time s4 to time s9, the internal pressure of the processing container 11 is maintained at the set pressure P2.

As described above, during the etching process, the opening degree of the valve 16 is small, and the discharge of the Hfac gas and the NO gas from the interior of the processing container 11 is suppressed. Therefore, the Hfac gas and the NO gas can be caused to stay inside the processing container 11 during the period (from time s5 to time s6 and from time s7 to time s8) in which the supply of the NO gas and the Hfac gas is stopped. Accordingly, the etching can be caused to proceed even in that period.

By intermittently supplying the gases in this way, it is possible to more reliably reduce the amounts of the NO gas and the Hfac gas used. The number of cycles executed in the second process is not limited to three, and may be two, or four or more.

By the way, in the above-described first and second processes, the reducing gas for performing the reducing process for the natural oxide film 42 is not limited to the $H_2$ gas and may be, for example, an $NH_3$ (ammonia) gas or an $H_2S$ (hydrogen sulfide) gas. $H_2$, $NH_3$ and $H_2S$ are non-etching reducing gases that reduce Co without etching, and contain hydrogen atoms. The β-diketone used as the etching gas may be any one as long as it can form a complex having a vapor pressure lower than that of CoO. For example, a gas such trifluoroacetylacetone (also referred to as 1,1,1-trifluoro-2,4-pentanedione), acetylacetone or the like may be used in place of the Hfac gas.

Furthermore, the metallic film, which is provided on the surface of the wafer W and etched by supplying the β-diketone gas and the oxidizing gas after the reduction process performed by the supply of the reducing gas, is not limited to being composed of Co. Specifically, the metallic film may be a film made of, for example, Ni (nickel), Cu (copper), Mn (manganese), Zr (zirconium) or Hf (hafnium). Metal constituting the metallic film referred to herein does not mean a metal contained as an additive or impurity in the metallic film, but means a metal contained as a main component in the metallic film.

It should be understood that the embodiment disclosed herein is exemplary in all respects and not restrictive. The above-described embodiment may be omitted, replaced or modified in various forms without departing from the scope and spirit of the appended claims.

(Evaluation Tests)
Evaluation Test 1

In Evaluation test 1-1, in the first process described in FIG. 3, an etching process was performed by setting the pressure at the time of supplying the Hfac gas and the NO gas to a pressure equal to the pressure at the time of supplying the $H_2$ gas. The etching amount of the Co film 41 after the process was measured. The internal pressure of the processing container 11 was set to 50 to 90 Torr, the supply flow rate of the Hfac gas was set to 200 to 300 sccm, and the supply time from time t3 to t5 was set to 60 minutes.

Furthermore, tests in which the supply flow rate of the Hfac gas and the supply time from time t3 to t5 are set to 80 to 130 sccm and 60 minutes, 40 to 70 sccm and 72 minutes, and 10 to 30 sccm and 120 minutes, are referred to as Evaluation tests 1-2, 1-3 and 1-4, respectively. In Evaluation tests 1-1 to 1-4, images of the cross section of the surface portion after the process were acquired by a scanning electron microscope (SEM).

The etching amounts in Evaluation tests 1-1 to 1-4 were 19.0 nm, 20.0 nm, 17.2 nm and 23.5 nm, respectively, and a sufficient etching amount was secured in each of Evaluation tests 1-1 to 1-4. The total amounts of the Hfac gas (Hfac gas supply flow rate×Hfac gas supply time) supplied to the processing container 11 in Evaluation tests 1-1 to 1-4 are 12 to 18 L, 4.8 to 7.2 L, 2.88 to 5.04 L and 1.2 to 3.6 L, respectively. Therefore, it can be said that the amount of the Hfac gas required for processing the wafer W can be reduced by reducing the supply flow rate of the Hfac gas. Presumably, this is because, as described in the Detailed Description section of the present disclosure, the exhaust flow rate is reduced by reducing the supply amount of the Hfac gas while maintaining the internal pressure of the processing container 11, and the staying time of the gases in the processing container 11 is prolonged so that the gases can be used efficiently.

Furthermore, the surface roughness was compared in Evaluation tests 1-1 to 1-4. As a result, no significant deterioration was confirmed in any of Evaluation tests. Accordingly, from the results of Evaluation test 1, the effects of the process of the present disclosure were confirmed.

Evaluation Test 2

In Evaluation test 2-1, the first process described with reference to FIG. 3 was performed, and the supply amount (L/one sheet of wafer) of the Hfac gas required for processing one sheet of wafer W was calculated. The time between time t2 and time t3 during which the reduction process is performed was set to 300 seconds, the supply flow rate of the Hfac gas between time t3 and time t5 was set to 80 to 130 sccm, the etching time (between time t4 and time t5) was set to 1,100 seconds, and the pressure at the time of supplying the Hfac gas and the NO gas was set to $3.99 \times 10^4$ to $5.33 \times 10^4$ Pa (300 to 400 Torr).

Furthermore, an example in which the process was performed in the same manner as in Evaluation test 2-1 except that the supply flow rate of the Hfac gas between time t3 and time t5 was set to 40 to 70 sccm and the etching time was set to 1,300 seconds is referred to as Evaluation test 2-2.

Moreover, an example in which the process was performed in the same manner as in Evaluation test 2-1 except that the internal pressure of the processing container 11 between time t3 and time t5 was set to $0.66 \times 10^4$ Pa to $1.2 \times 10^4$ Pa (50 to 90 Torr) and the etching time (from time t3 to time t5) was set to 3,600 seconds is referred to as a Reference test.

When the etching amounts were compared in Evaluation tests 2-1 and 2-2 and Reference test, they were almost the same. The supply amounts (L/one sheet of wafer) of the Hfac gas required for processing one sheet of wafer W in Evaluation tests 2-1 and 2-2 and Reference test were 1.83 L/wafer, 1.08 L/wafer and 6 L/wafer, respectively.

Furthermore, in Evaluation tests 2-1 and 2-2 and Reference test, the number of processed wafers W per hour was calculated based on the time taken to process one sheet of wafer W. The numbers of processed wafers W per hour in Evaluation tests 2-1 and 2-2 and Reference test were 3.62 sheets/hour, 3.28 sheets/hour and 1.71 sheets/hour, respectively.

It can be noted that in both Evaluation tests 2-1 and 2-2, as compared with Reference test, the supply amount of the Hfac gas required for processing one sheet of wafer W is small and the number of processed wafers W per hour is large. Accordingly, it can be said that, by increasing the pressure at the time of supplying the Hfac gas and the NO gas, it is possible to shorten the process time and to reduce the amount of the Hfac gas required for processing the wafer W.

In Evaluation test 2-2, the supply amount of the Hfac gas required for processing one sheet of wafer W is smaller than that in Evaluation test 2-1. Accordingly, it can be said that, by reducing the flow rate of the Hfac gas supplied into the processing container 11, it is possible to further reduce the amount of the Hfac gas required for processing the wafer W.

According to the present disclosure in some embodiments, it is possible to shorten a process time and to reduce amounts of gases required for processing when etching a metallic film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An etching method, comprising:
   loading a substrate having a metallic film formed on the substrate into a processing container;
   after the loading the substrate into the processing container, supplying a reducing gas for reducing a surface of the metallic film into the processing container; and
   after the supplying the reducing gas, oxidizing and etching the metallic film by setting an internal pressure of the processing container to a pressure, which is higher than $2.40 \times 10^4$ Pa and is higher than an internal pressure of the processing container in the supplying the reducing gas, and intermittently supplying an oxidizing gas for oxidizing the metallic film and an etching gas comprising β-diketone into the processing container without supplying the reducing gas.

2. The etching method of claim 1, wherein a supply flow rate of the etching gas in the oxidizing and etching the metallic film is 500 sccm or less.

3. The etching method of claim 1, wherein the metallic film is made of one selected from the group of cobalt, nickel, copper and manganese.

4. The etching method of claim 1, wherein the reducing gas is a gas that has a non-etching property to the metallic film and contains hydrogen atoms.

5. The etching method of claim 1, wherein, when a former section of a period in which the oxidizing and etching the metallic film is performed is assumed to be a first period and a latter section of the period is assumed to be a second period, a flow rate of the oxidizing gas and a flow rate of the etching gas in the second period are smaller than a flow rate of the oxidizing gas and a flow rate of the etching gas in the first period, respectively.

6. The etching method of claim 1, wherein the oxidizing gas includes a nitric oxide gas or a carbon monoxide gas.

7. The etching method of claim 1, wherein the intermittently supplying the oxidizing gas and the etching gas comprises alternately supplying the oxidizing gas and the etching gas for a preset period and stopping the supplying the oxidizing gas and the etching gas.

8. The etching method of claim 1, further comprising:
   performing, by an exhaust flow rate changing part configured to change a flow rate of an exhaust path connected to the processing container, the supplying the reducing gas in a first state, and the oxidizing and etching the metallic film in a second state.

9. The etching method of claim 8, wherein the exhaust flow rate changing part is a valve provided in the exhaust path,
   the first state is a state in which the valve has a first opening degree, and
   the second state is a state in which the valve has a second opening degree that is smaller than the first opening degree.

10. The etching method of claim 9, wherein a supply flow rate of the etching gas in the oxidizing and etching the metallic film is 500 sccm or less.

11. The etching method of claim 10, wherein the metallic film is made of one selected from the group of cobalt, nickel, copper and manganese.

12. The etching method of claim 11, wherein the metallic film is made of cobalt.

13. The etching method of claim 12, wherein the reducing gas is a gas that has a non-etching property to the metallic film and contains hydrogen atoms.

14. The etching method of claim 13, wherein the reducing gas includes one selected from the group of an $H_2$ gas, an $NH_3$ gas and an $H_2S$ gas.

15. The etching method of claim 13, wherein, when a former section of a period in which the oxidizing and etching the metallic film is performed is assumed to be a first period and a latter section of the period is assumed to be a second period, a flow rate of the oxidizing gas and a flow rate of the etching gas in the second period are smaller than a flow rate of the oxidizing gas and a flow rate of the etching gas in the first period, respectively.

16. The etching method of claim 15, wherein the oxidizing gas includes a nitric oxide gas or a carbon monoxide gas.

* * * * *